(12) United States Patent
Zhao et al.

(10) Patent No.: US 12,354,902 B2
(45) Date of Patent: Jul. 8, 2025

(54) WAFER PROCESSING METHOD

(71) Applicant: DISCO CORPORATION, Tokyo (JP)

(72) Inventors: Jinyan Zhao, Tokyo (JP); Shigenori Harada, Tokyo (JP)

(73) Assignee: DISCO CORPORATION, Tokyo (JP)

(*) Notice: Subject to any disclaimer, the term of this patent is extended or adjusted under 35 U.S.C. 154(b) by 585 days.

(21) Appl. No.: 17/659,103

(22) Filed: Apr. 13, 2022

(65) Prior Publication Data
US 2022/0367231 A1 Nov. 17, 2022

(30) Foreign Application Priority Data

May 11, 2021 (JP) .................................. 2021-080423

(51) Int. Cl.
*H01L 21/683* (2006.01)
*H01L 21/78* (2006.01)

(52) U.S. Cl.
CPC .......... *H01L 21/6836* (2013.01); *H01L 21/78* (2013.01); *H01L 2221/68336* (2013.01)

(58) Field of Classification Search
CPC ....... B28D 5/0082–0094; B28D 5/0005–0052; B26D 1/15; H01L 21/6836; H01L 21/78; H01L 2221/68336; H01L 2221/68327; H01L 21/67132; H01L 21/02013; H01L 21/02024; H01L 21/2633; H01L 21/463; H01L 21/4842; H01L 21/4878; H01L 21/4896

See application file for complete search history.

(56) References Cited

U.S. PATENT DOCUMENTS

2020/0094557 A1* 3/2020 Nakano .................. B41J 2/1631

FOREIGN PATENT DOCUMENTS

| JP | 2008192945 A | 8/2008 |
| JP | 2009272502 A | 11/2009 |
| JP | 2016174082 A | 9/2016 |

OTHER PUBLICATIONS

Office Action issued in counterpart Japanese patent application No. 2021-080423, dated Feb. 3, 2025.

* cited by examiner

*Primary Examiner* — Cuong B Nguyen
(74) *Attorney, Agent, or Firm* — Greer Burns & Crain Ltd.

(57) ABSTRACT

A wafer processing method includes an affixing step of affixing a wafer to a sheet via a die attach layer having a diameter larger than a diameter of the wafer, to thereby form a protruding portion of the die attach layer on a periphery of the wafer, and a protruding portion removing step of removing the protruding portion from the sheet by bringing a removing member into contact with the protruding portion.

10 Claims, 7 Drawing Sheets

WAFER PROCESSING METHOD

BACKGROUND OF THE INVENTION

Field of the Invention

The present invention relates to a wafer processing method.

Description of the Related Art

Conventionally, a die attach film is widely used to mount device chips onto a mounting substrate. A tape referred to as a two-in-one (2-in-1) tape, in which a die attach layer made of a die attach film is formed on a tape that is later expanded while holding a wafer, is also widely used.

The diameter of the die attach layer is formed to be larger than the diameter of the wafer in consideration of positional displacement of the wafer which occurs when the wafer is affixed onto the die attach layer formed on the tape. Therefore, in the state in which the wafer is affixed to the tape, a protruding portion of the die attach layer is formed on the periphery of the wafer.

Modified layers serving as division starting points, for example, are formed in the wafer by a laser processing apparatus. When the tape is expanded, the wafer is ruptured at the modified layers and divided into individual chips. At this time, the die attach film forming the die attach layer is also ruptured together as the wafer is divided into the chips.

Here, when the die attach film is ruptured, there is a fear that the protruding portion of the die attach film is peeled off from the tape, adhering to surfaces of divided chips. The die attach film adhering to device surfaces of the chips can cause the devices to be damaged or cause a mounting defect in a subsequent mounting step.

In view of the above circumstances, Japanese Patent Laid-Open No. 2009-272502, for example, proposes an expanding apparatus that prevents scattering of a protruding portion of a die attach film by pressing the protruding portion.

SUMMARY OF THE INVENTION

With the configuration of Japanese Patent Laid-Open No. 2009-272502, for example, the die attach film affixed to a pressing member may float inside the expanding apparatus and adhere onto devices. It can thus be said that it is difficult to completely prevent the scattering of fragments of the die attach film.

In addition, if the protruding portion of the die attach film is ruptured and adheres to any part inside the expanding apparatus, the protruding portion can drop afterward in unintended timing, float inside the expanding apparatus, and adhere to devices. Improvements have therefore been desired.

It is accordingly an object of the present invention to provide a wafer processing method that, when a protruding portion of a die attach layer is ruptured, can reliably prevent the ruptured part from adhering onto devices.

In accordance with an aspect of the present invention, there is provided a wafer processing method including an affixing step of affixing a wafer to a sheet via a die attach layer having a diameter larger than a diameter of the wafer, to thereby form a protruding portion of the die attach layer on a periphery of the wafer, and a protruding portion removing step of removing the protruding portion from the sheet by bringing a removing member into contact with the protruding portion.

Preferably, the removing member is formed by a tape having an adhesive layer laminated on a base material. Preferably, the wafer processing method further includes a removing unit preparing step of preparing a removing unit including a first annular frame having an opening formed at a center thereof, the removing member covering the opening, and a protective layer formed on the removing member at a position corresponding to the wafer inside the opening, and the protruding portion removing step removes the protruding portion by bringing the adhesive layer of the removing member into contact with the protruding portion while making the protective layer of the removing unit face the wafer.

Preferably, the wafer processing method further includes a division starting point forming step of forming, inside the wafer, division starting points to be used to divide the die attach layer, before or after the affixing step, and an expanding step of expanding the sheet in a state in which the division starting points have been formed inside the wafer and the protruding portion has been removed from the sheet, to thereby form a plurality of chips to each of which the die attach layer is laminated.

Preferably, the sheet to which the wafer is affixed is fixed to a second annular frame for holding the wafer, a positioning portion is formed in each of the second annular frame for holding the wafer and the first annular frame of the removing unit, and in the protruding portion removing step, the position of the protective layer is made to coincide with the position of the wafer by aligning the positioning portions of the first and second annular frames with each other.

According to the present invention, the protruding portion of the die attach layer is removed from the sheet before the expansion of the wafer is performed. It is therefore possible to prevent occurrence of such a problem that the protruding portion ruptured when the expansion is performed is peeled off from the sheet and adheres to surfaces of divided chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
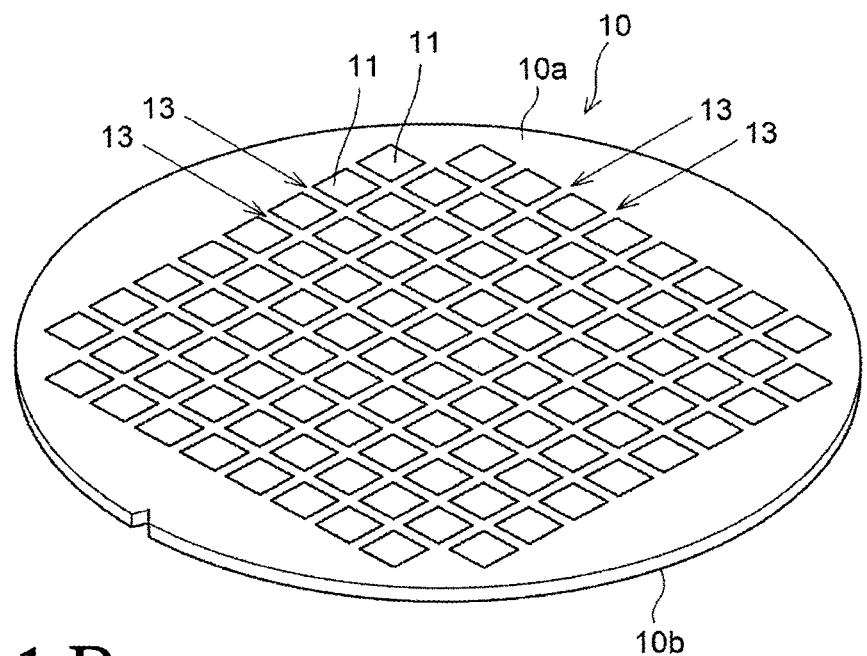
FIG. 1A is a perspective view of a wafer as an example of a workpiece.

An embodiment of the present invention will hereinafter be described with reference to the accompanying drawings. FIG. 1A illustrates a wafer 10 as an example of a workpiece. A plurality of devices 11 are formed at intervals on a top surface 10a of the wafer 10. Planned dividing lines 13 are set in a lattice manner between the respective devices 11.

Figure 2:
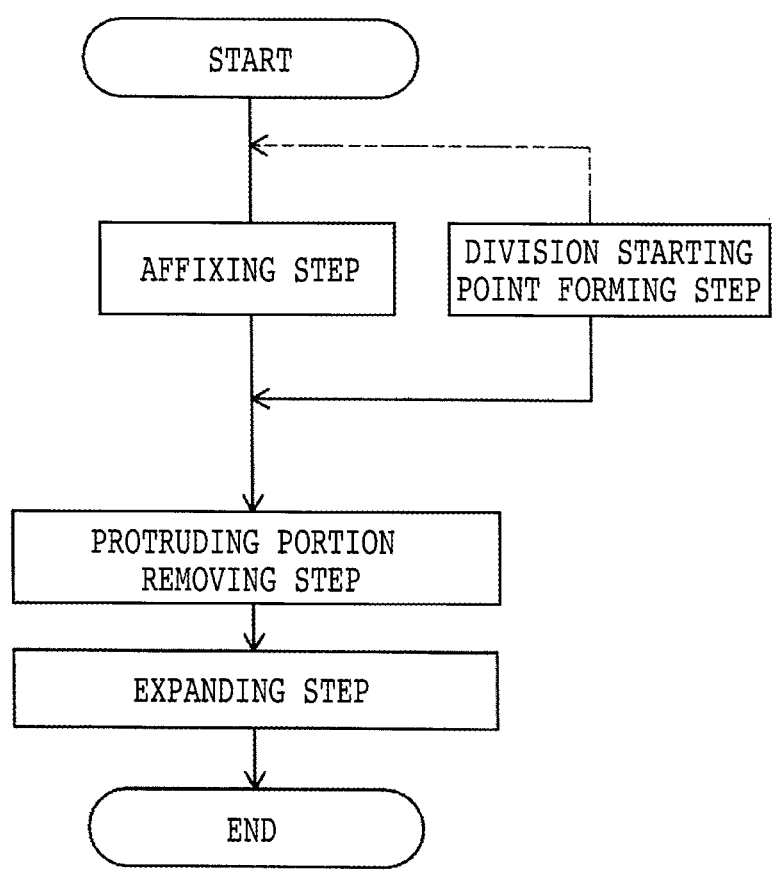
FIG. 2 is a flowchart of a processing method using the present invention.

A processing method using the present invention will be described in the following according to a flowchart illustrated in FIG. 2.

<Affixing Step>

Figure 1B:
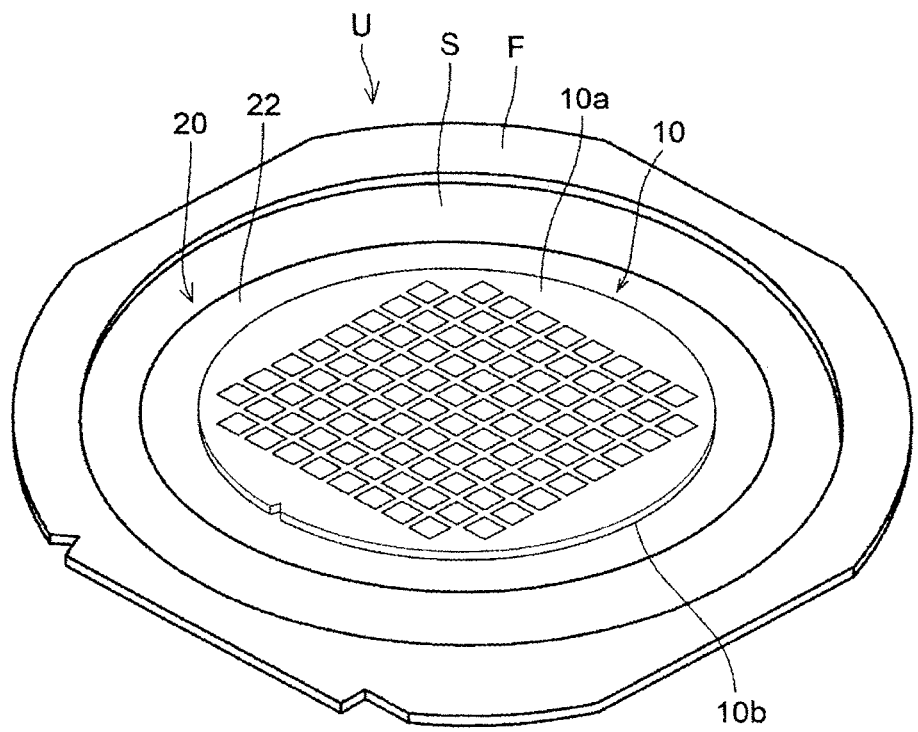
FIG. 1B is a perspective view of a wafer unit.

As illustrated in FIG. 1B, the affixing step is a step of affixing an undersurface 10b of the wafer 10 to a sheet S via a die attach layer 20 having a diameter larger than a diameter of the wafer 10, to thereby form a protruding portion 22 of the die attach layer 20 on the periphery of the wafer 10.

More specifically, as illustrated in FIG. 1B, the die attach layer 20 is formed on a top surface of the sheet S, and the undersurface 10b of the wafer 10 is affixed to a top surface of the die attach layer 20. An annular frame F is affixed to the top surface of the sheet S in such a manner as to surround the wafer 10. A wafer unit U in which the wafer 10 and the annular frame F are integrated with each other is thus formed.

The die attach layer 20 is formed with a diameter larger than that of the wafer 10 so as to house the wafer 10 therein reliably. The protruding portion 22 protruding relative to the periphery of the wafer 10 is formed in an annular shape so as to surround the periphery of the wafer 10.

Incidentally, in a case where the sheet S is formed as what is generally called a 2-in-1 tape, the die attach layer 20 is integrally laminated to a top layer of the sheet S. Alternatively, the die attach layer may be formed by affixing a separate die attach film to the sheet S, or the die attach layer may be formed by applying a die attach agent in a liquid state to the sheet S.

<Division Starting Point Forming Step>

The division starting point forming step is a step of forming, in the wafer, division starting points to be used to divide the die attach layer 20 and is performed before or after the affixing step. The division starting points are formed along the planned dividing lines 13 (FIG. 1A).

In a case of forming modified layers along the planned dividing lines 13 inside the wafer 10 by laser processing, for example, the modified layers are used as the division starting points of the wafer 10. The wafer 10 is divided into chips at the division starting points of the wafer 10, and the die attach layer 20 is also ruptured at the same time when the wafer 10 is divided into chips. Therefore, the division starting points of the wafer 10 also function as the division starting points of the die attach layer 20.

Alternatively, a state similar to that of FIG. 1B may be obtained by transferring, to the die attach layer 20 on the sheet S, a wafer already divided into chips by dicing before grinding (DBG) processing or stealth dicing before grinding (SDBG) processing. In this case, gaps (grooves) between the chips function as the division starting points of the die attach layer 20.

<Protruding Portion Removing Step>

Figure 3A:
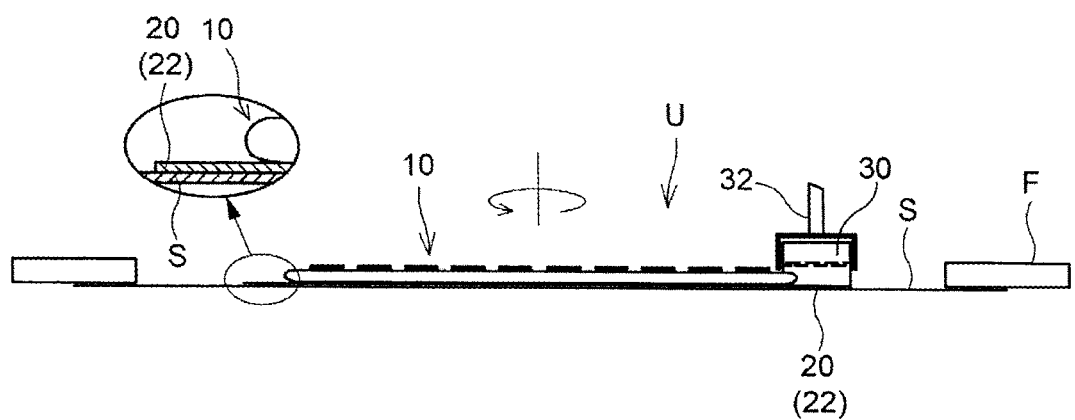
FIG. 3A is a sectional view illustrating a protruding portion removing step.
Figure 3B:
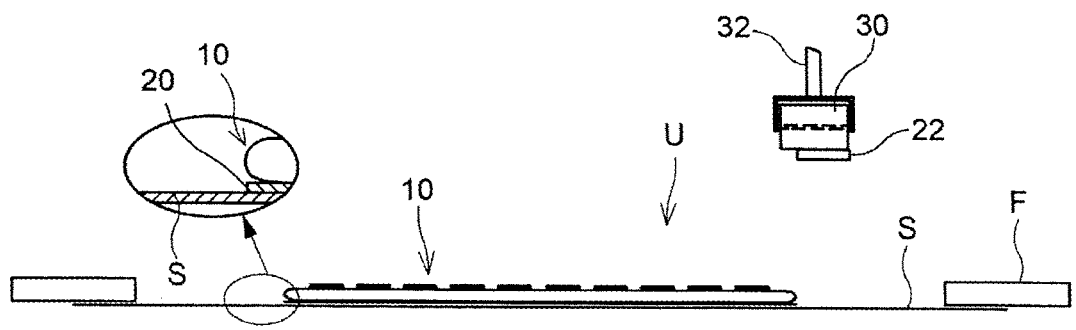
FIG. 3B is a sectional view of a state in which a protruding portion has been removed.

As illustrated in FIG. 3A and FIG. 3B, the protruding portion removing step is a step of removing the protruding portion 22 from the sheet S by bringing the protruding portion 22 into contact with a removing member 30.

FIG. 3A and FIG. 3B are sectional views of assistance in explaining a first example of the protruding portion removing step. The removing member 30 includes a tubular member rotatably supported at a distal end of an arm 32. The surface of the tubular member includes a material having tackiness (adhesive property) with respect to the die attach layer 20 (protruding portion 22).

When the removing member 30 is pressed against the protruding portion 22 to be bonded, and the wafer unit U is rotated relative to the removing member 30, the part of the protruding portion 22 of the die attach layer 20 is transferred to the removing member 30 side, and the protruding portion 22 is removed from the sheet S as illustrated in FIG. 3B.

FIGS. 4A to 4D are perspective views illustrating a second example of the protruding portion removing step. In this second example, the protruding portion removing step is performed after a removing unit 34 is prepared which includes an annular frame 35 having an opening formed at a center thereof, a removing member 33 covering the opening, and a protective layer 37 formed on the removing member 33 at a position corresponding to the wafer 10 inside the opening.

Figure 4A:
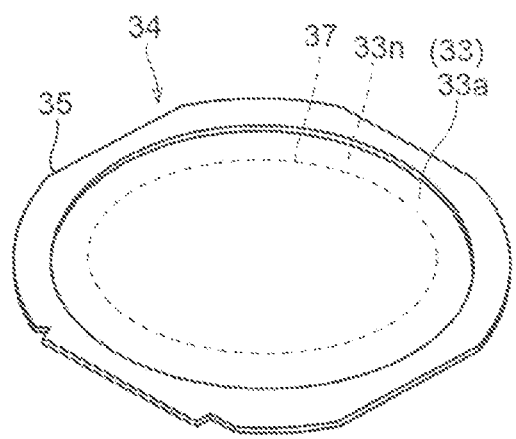
FIG. 4A is a perspective view of a top surface side of a removing unit.

FIG. 4A illustrates a configuration of a top surface of the removing unit 34 in which the removing member 33 and the annular frame 35 are integrated with each other by affixing an outer circumferential edge of the removing member 33 to an undersurface side of the annular frame 35. The removing member 33 is formed by a tape having an adhesive layer laminated on a base material. A top surface 33a side of the removing member 33 is formed by a surface without an adhesive layer.

Figure 4B:
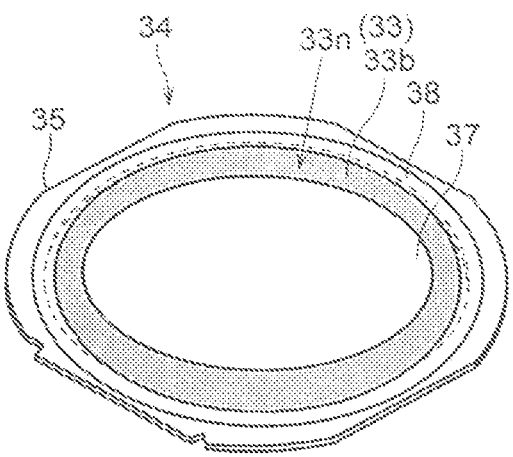
FIG. 4B is a perspective view of an undersurface side of the removing unit.

FIG. 4B illustrates a configuration of an undersurface of the removing unit 34. An adhesive layer 33n is formed on an undersurface 33b of the removing member 33. In addition, the protective layer 37 not having an adhesive property is formed on a part to be made to face the wafer 10 in the removing member 33. The protective layer 37 is to prevent adhesion of the adhesive layer 33n of the removing member 33 to a device formation region of the wafer 10. The protective layer 37 can be formed by, for example, affixing a film not having an adhesive property to the undersurface 33b of the removing member 33.

As illustrated in FIG. 4B, on the undersurface 33b of the removing member 33, an annular protective layer 38 may be formed at an interval from the protective layer 37 in such a manner as to surround the protective layer 37. The annular protective layer 38 is to prevent adhesion of the adhesive layer 33n of the removing member 33 to the annular frame F (FIG. 4C) of the wafer unit U. The annular protective layer 38 can be formed by, for example, affixing an annular film not having an adhesive property to the undersurface 33b of the removing member 33.

Figure 4C:
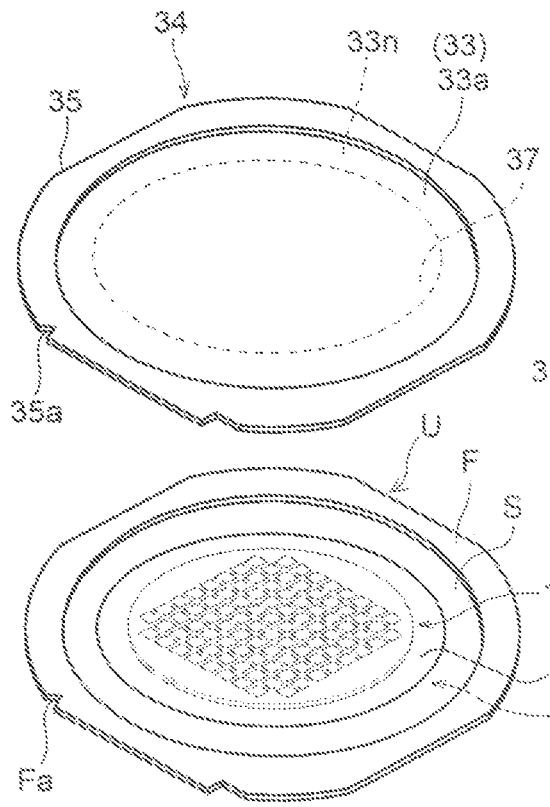
FIG. 4C is a perspective view of a state in which the wafer unit and the removing unit are made to face each other.
Figure 4D:
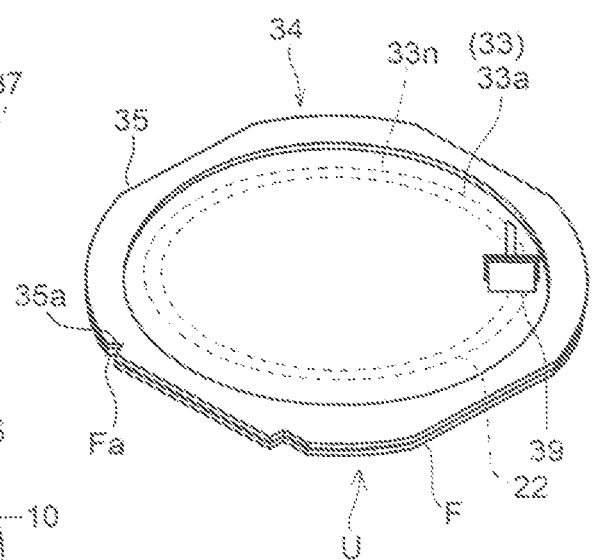
FIG. 4D is a perspective view of a state in which the wafer unit and the removing unit are superposed on each other.

As illustrated in FIG. 4B, the adhesive layer 33n of the removing member 33 is exposed in an annular region between the protective layer 37 and the annular protective layer 38. As illustrated in FIG. 4C, the wafer unit U and the removing unit 34 are made to face each other. As illustrated in FIG. 4D, the wafer unit U and the removing unit 34 are then laminated to each other. At this time, the wafer 10 is covered by the protective layer 37, and the protruding portion 22 is covered by the adhesive layer 33n.

Then, as illustrated in FIG. 4D, a roller 39 is pressed against a position corresponding to the protruding portion 22 from the top surface 33a side of the removing member 33. The protruding portion 22 of the die attach layer 20 is thereby bonded to the undersurface 33b (adhesive layer 33n) of the removing member 33 and is removed from the sheet S.

As described above, in the protruding portion removing step, the removing unit 34 is prepared in advance, and the adhesive layer 33n of the removing member 33 is brought into contact with the protruding portion 22 while the protective layer 37 of the removing unit 34 is made to face the wafer 10. The protruding portion removing step thereby removes the protruding portion 22.

Incidentally, a diameter of the protective layer 37 facing the wafer 10 can be set to be the same as the diameter of the wafer 10. Alternatively, it can be set to be larger than the device formation region of the wafer 10 but smaller than the diameter of the wafer 10. As a result, on the undersurface 33b of the removing member 33, the protective layer 37 masks a region corresponding to the device formation region (region in which the devices are formed) of the wafer 10. It is thereby possible to prevent a problem such as damage to the devices that could be caused due to adhesion of the adhesive layer 33n of the removing member 33 to the region.

In addition, the following can be adopted in order to reliably make the protective layer 37 coincide with the position of the wafer 10 when the wafer unit U and the removing unit 34 are made to face each other as illustrated in FIG. 4C.

Specifically, as illustrated in FIG. 4C and FIG. 4D, the sheet S to which the wafer 10 is affixed is fixed to the annular frame F for holding the wafer, and positioning portions Fa and 35a are formed in the annular frame F for holding the wafer and the annular frame 35 of the removing unit 34, respectively. In the protruding portion removing step, the position of the protective layer 37 is made to coincide with the position of the wafer 10 by aligning the positioning portions Fa and 35a of the two annular frames F and 35 with each other.

Consequently, because the positions of the wafer 10 and the protective layer 37 coincide with each other, adhesion of the adhesive layer 33n of the removing member 33 to the wafer 10 can reliably be prevented. Incidentally, the positioning portions Fa and 35a can, for example, be notch portions formed in outer circumferential portions of the annular frames F and 35. In addition, not only the annular frames F and 35 in the same shape but also the annular frames F and 35 in shapes different from each other may be used. The shape of the annular frames F and 35 is thus not particularly limited.

<Expanding Step>

The expanding step is a step of forming a plurality of chips to which the die attach layer is laminated by expanding the sheet in the state in which the division starting points have been formed inside the wafer and the protruding portion has been removed from the sheet.

Figure 5A:
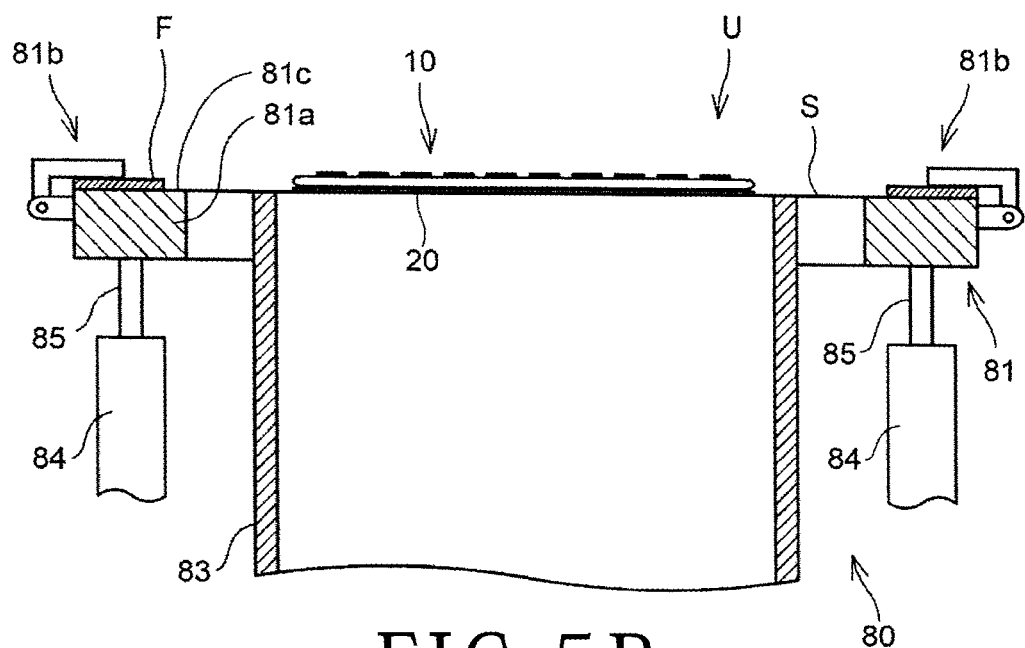
FIG. 5A is a sectional view illustrating an expanding step.
Figure 5B:
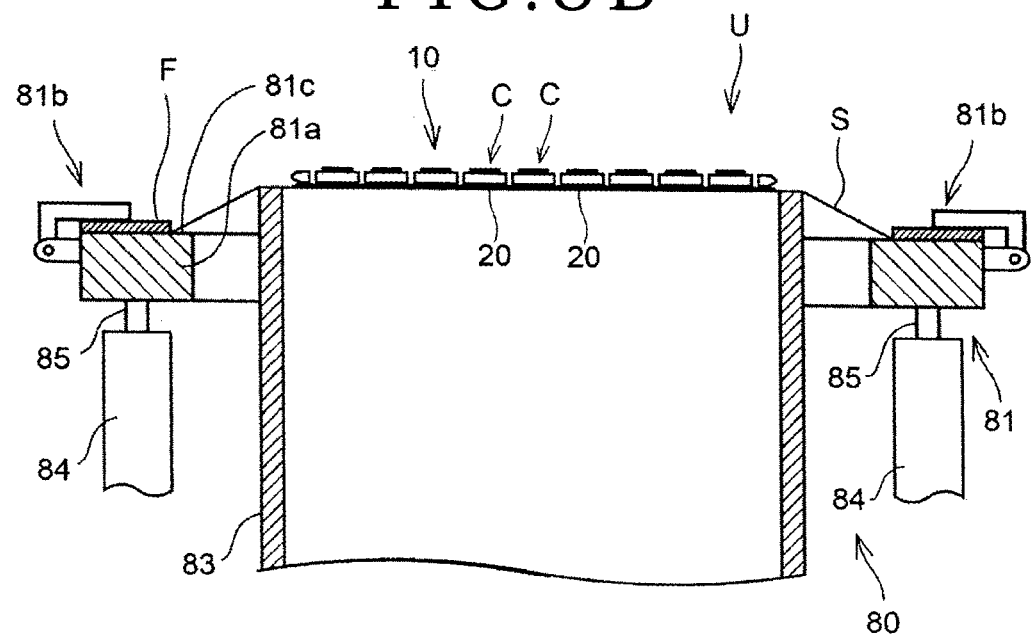
FIG. 5B is a sectional view of a state in which the wafer has been divided into chips.

The expanding step can, for example, be performed by an expanding apparatus 80 illustrated in FIG. 5A and FIG. 5B. The expanding apparatus 80 includes frame holding means 81 for holding the annular frame F of the wafer unit U, and driving means 84 as tape enlarging means for enlarging (expanding) the sheet S affixed to the annular frame F held by the frame holding means 81.

The frame holding means 81 includes a frame holding member 81a and a plurality of clamp mechanisms 81b arranged on the periphery of the frame holding member 81a. An upper surface of the frame holding member 81a forms a placement surface 81c on which the annular frame F is placed. The annular frame F placed on the placement surface 81c is fixed to the frame holding member 81a by the clamp mechanisms 81b. The frame holding means 81 is supported by the driving means 84 in such a manner as to be capable of advancing or retreating in an upward-downward direction.

An expanding drum 83 is disposed inside the annular frame holding member 81a. The expanding drum 83 has an inside diameter and an outside diameter smaller than an inside diameter of the annular frame F but larger than the outside diameter of the wafer 10 affixed to the sheet S affixed to the annular frame F.

The driving means 84 for advancing or retreating the frame holding member 81a in the upward-downward direction includes a plurality of air cylinders. Piston rods 85 of the air cylinders are coupled to a lower surface of the frame holding member 81a.

The driving means 84 is configured to move the frame holding member 81a in the upward-downward direction between a reference position (FIG. 5A) at which the placement surface 81c is at substantially the same height as an upper end of the expanding drum 83 and an expansion position (FIG. 5B) at which the placement surface 81c is at a height lower than the upper end of the expanding drum 83 by a predetermined amount.

With the above configuration, when conditions in which the die attach layer 20 is cooled are set as a cooling atmosphere, the driving means 84 is driven to lower the frame holding member 81a in the state in which the clamp mechanisms 81b hold the annular frame F as illustrated in FIG. 5A. The sheet S is thus expanded while being held by the expanding drum 83 from a lower side as illustrated in FIG. 5B.

When the sheet S is expanded, an external force spreading in a radial direction acts on the wafer 10 affixed to the sheet S, and this external force divides the wafer 10 into chips C with the modified layers as starting points. Along with the division into the chips C, the part of the die attach layer 20 integrated with the respective chips C is ruptured and is divided together with the chips C.

In the above expanding step, the protruding portion 22 (FIG. 1B and FIG. 3B) of the die attach layer 20 has been removed from the sheet S before the expansion of the wafer 10 is performed. It is therefore possible to prevent occurrence of such a problem that the protruding portion 22 ruptured when the expansion is performed is peeled off from the sheet S, and adheres to the surfaces of the divided chips C.

In the above description, the protruding portion removing step is performed as illustrated in FIG. 3A and FIG. 3B after the wafer unit U is formed, and thereafter the expanding step is performed. However, the wafer unit U may be formed after the protruding portion removing step and the expanding step are performed first.

Figure 6A:
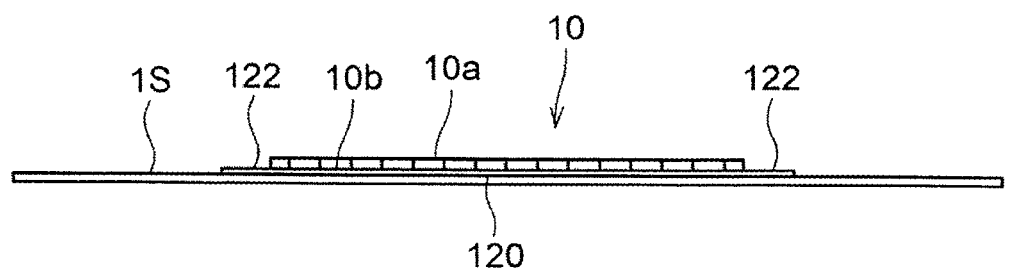
FIG. 6A is a sectional view illustrating an affixing step.
Figure 6B:
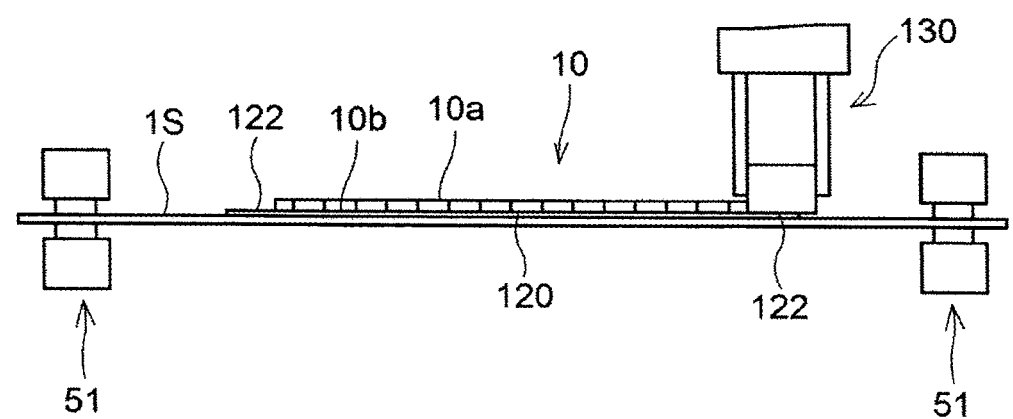
FIG. 6B is a sectional view illustrating removal of a protruding portion.

Specifically, first, as illustrated in FIG. 6A, the undersurface 10b of the wafer 10 is affixed to a sheet 1S via a die attach layer 120 of a diameter larger than the diameter of the wafer 10. Next, as illustrated in FIG. 6B, a removing member 130 is brought into contact with a protruding portion 122, to thereby remove the protruding portion 122 from the sheet 1S. At this time, an edge part of the sheet 1S is held by clamps 51.

Figure 6C:
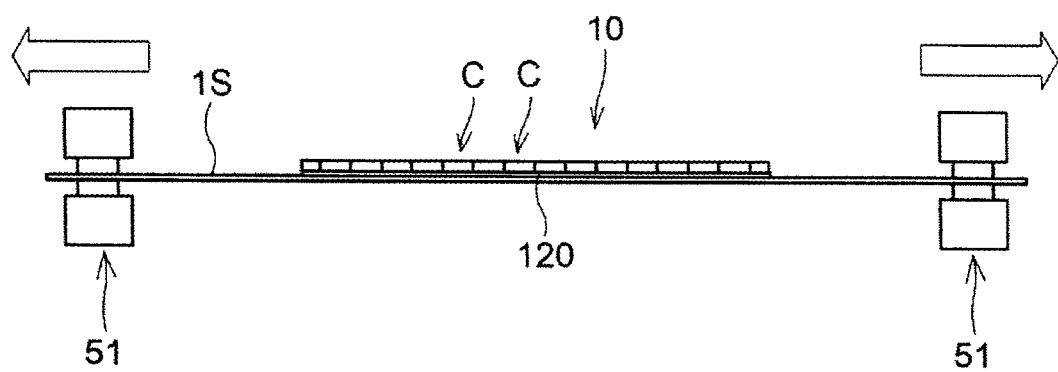
FIG. 6C is a sectional view illustrating a manner in which the wafer is divided into chips by expansion.

Next, as illustrated in FIG. 6C, the sheet 1S is expanded by moving the clamps 51. Consequently, the die attach layer 120 is ruptured together with the wafer 10 and is divided into chips C. At this time, the die attach layer 120 is cooled in a cooling atmosphere.

In addition, at the time when the chips C are obtained by division, the protruding portion 122 has already been removed from the sheet 1S. It is therefore possible to prevent occurrence of such a problem that the protruding portion 122 ruptured when the expansion is performed is peeled off from the sheet 1S, and adheres to the surfaces of the divided chips C.

Figure 7A:
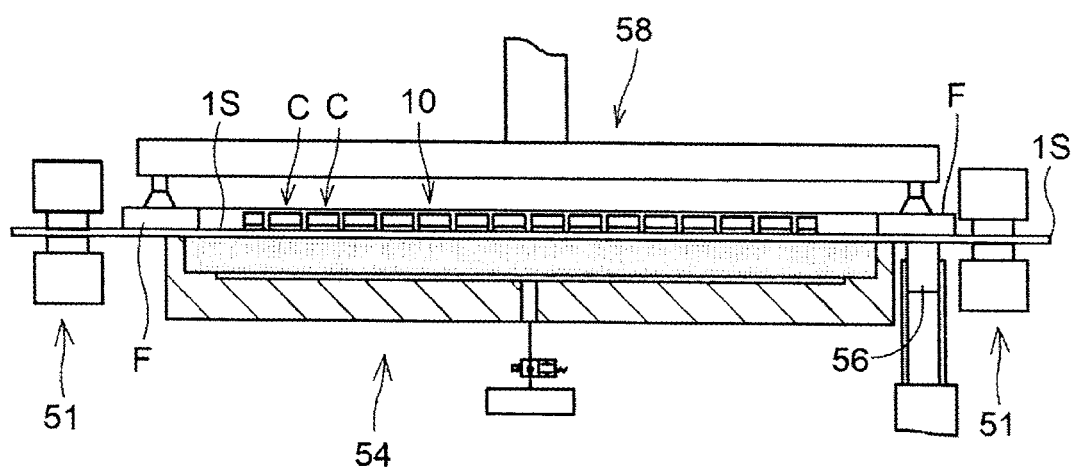
FIG. 7A is a sectional view illustrating affixation of an annular frame.

Next, as illustrated in FIG. 7A, the wafer 10 is held under suction via the sheet 1S by a holding table 54, and the annular frame F is affixed to a top surface of the sheet 1S in such a manner as to surround the wafer 10. At this time, a roller 56 is used to press the sheet 1S from a lower side of the annular frame F, and therefore, the annular frame F is securely bonded to the sheet 1S. In addition, at this time, the annular frame F is pressed from an upper side thereof by a pressing apparatus 58.

Figure 7B:
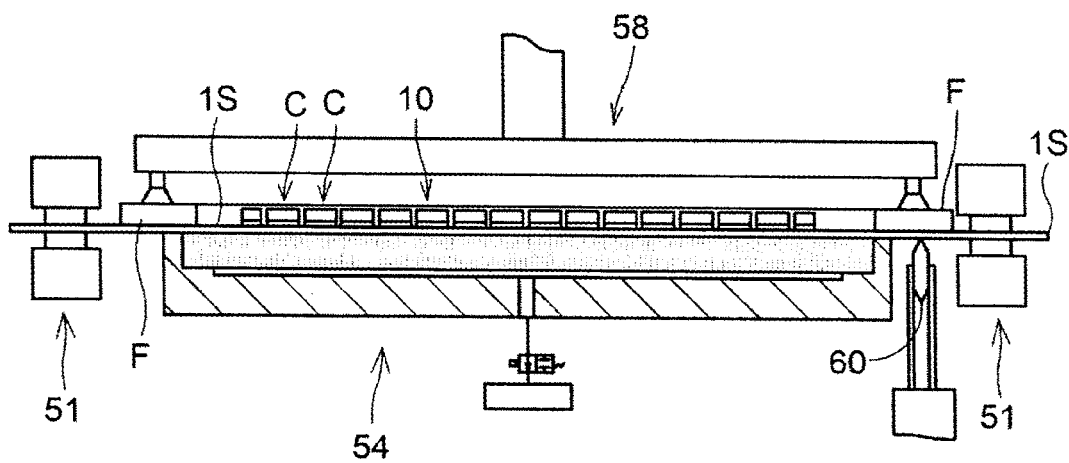
FIG. 7B is a sectional view illustrating a manner in which an outer circumferential portion of a sheet is removed by a cutter apparatus.

Next, as illustrated in FIG. 7B, at the position corresponding to the annular frame F, a cutter apparatus 60 is pressed from a lower side of the sheet 1S and rotated, so that an outer circumferential portion of the sheet 1S is removed. The wafer unit U illustrated in FIG. 1 is thereby formed.

In the wafer unit U thus formed, gaps are formed between the respective chips C. In addition, the die attach layer is formed on an undersurface of each of the chips C.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method comprising:
   an affixing step of affixing a wafer to a sheet via a die attach layer having a diameter larger than a diameter of the wafer, to thereby form a protruding portion of the die attach layer on a periphery of the wafer;
   a protruding portion removing step of removing the protruding portion from the sheet by bringing a removing member into contact with the protruding portion; and
   an expanding step of expanding the sheet in a state in which the protruding portion has been removed from the sheet.

2. The wafer processing method according to claim 1, wherein:
   the removing member is formed by a tape having an adhesive layer laminated on a base material.

3. The wafer processing method according to claim 2, further comprising:
   a removing unit preparing step of preparing a removing unit including a first annular frame having an opening formed at a center thereof, the removing member covering the opening, and a protective layer formed on the removing member at a position corresponding to the wafer inside the opening,
   wherein the protruding portion removing step removes the protruding portion by bringing the adhesive layer of the removing member into contact with the protruding portion while making the protective layer of the removing unit face the wafer.

4. The wafer processing method according to claim 1, further comprising:
   a division starting point forming step of forming, inside the wafer, division starting points to be used to divide the die attach layer, before or after the affixing step,
   wherein, in the expanding step, the sheet is expanded in a state in which the division starting points have been formed inside the wafer and the protruding portion has been removed from the sheet, to thereby be formed a plurality of chips to each of which the die attach layer is laminated.

5. The wafer processing method according to claim 3, wherein:
   the sheet to which the wafer is affixed is fixed to a second annular frame for holding the wafer,
   a positioning portion is formed in each of the second annular frame for holding the wafer and the first annular frame of the removing unit, and,
   in the protruding portion removing step, the position of the protective layer is made to coincide with the position of the wafer by aligning the positioning portions of the first and second annular frames with each other.

6. The wafer processing method according to claim 1, wherein a surface of the tubular member which contacts the protruding portion is made of a material which adheres to the protruding portion.

7. A wafer processing method comprising:
   an affixing step of affixing a wafer to a sheet via a die attach layer having a diameter larger than a diameter of the wafer, to thereby form a protruding portion of the die attach layer on a periphery of the wafer; and
   a protruding portion removing step of removing the protruding portion from the sheet by bringing a removing member, which is formed by a tape having an adhesive layer laminated on a base material, into contact with the protruding portion.

8. The wafer processing method according to claim 7, further comprising:
   a removing unit preparing step of preparing a removing unit including a first annular frame having an opening formed at a center thereof, the removing member covering the opening, and a protective layer formed on the removing member at a position corresponding to the wafer inside the opening,
   wherein the protruding portion removing step removes the protruding portion by bringing the adhesive layer of the removing member into contact with the protruding portion while making the protective layer of the removing unit face the wafer.

9. A wafer processing method comprising:
   an affixing step of affixing a wafer to a sheet via a die attach layer having a diameter larger than a diameter of the wafer, to thereby form a protruding portion of the die attach layer on a periphery of the wafer;
   a protruding portion removing step of removing the protruding portion from the sheet by bringing a removing member into contact with the protruding portion;
   a division starting point forming step of forming, inside the wafer, division starting points to be used to divide the die attach layer, before or after the affixing step; and
   an expanding step of expanding the sheet in a state in which the division starting points have been formed inside the wafer and the protruding portion has been removed from the sheet, to thereby form a plurality of chips to each of which the die attach layer is laminated.

10. The wafer processing method according to claim 9, wherein:
- the sheet to which the wafer is affixed is fixed to a second annular frame for holding the wafer,
- a positioning portion is formed in each of the second annular frame for holding the wafer and the first annular frame of the removing unit, and,
- in the protruding portion removing step, the position of the protective layer is made to coincide with the position of the wafer by aligning the positioning portions of the first and second annular frames with each other.

* * * * *